United States Patent [19]

Matsuta

[11] Patent Number: 4,637,070
[45] Date of Patent: Jan. 13, 1987

[54] UHF MIXING CIRCUIT HAVING $\pi$ CONFIGURED IMPEDANCE CONVERTER

[75] Inventor: Shigetoshi Matsuta, Soma, Japan

[73] Assignee: Alps Electric Co., Ltd., Japan

[21] Appl. No.: 522,470

[22] Filed: Aug. 11, 1983

[30] Foreign Application Priority Data

Aug. 12, 1982 [JP] Japan ............................ 57-123037[U]

[51] Int. Cl.[4] ............................................ H03H 11/28
[52] U.S. Cl. .................................... 455/331; 455/338; 333/32
[58] Field of Search ................. 333/32, 177, 178, 175; 455/323, 313, 319, 325–327, 331, 330, 338, 333; 334/41, 45

[56] References Cited

U.S. PATENT DOCUMENTS

| | | | |
|---|---|---|---|
| 2,921,189 | 1/1960 | Nash ................................ | 455/331 X |
| 2,978,578 | 4/1961 | Waring ............................. | 333/32 X |
| 3,571,722 | 3/1971 | Vendelin .......................... | 455/327 |
| 3,886,458 | 5/1975 | Matsumoto et al. ........... | 455/333 X |

*Primary Examiner*—Eugene R. LaRoche
*Assistant Examiner*—Benny Lee
*Attorney, Agent, or Firm*—Guy W. Shoup

[57] ABSTRACT

In a UHF tuner having a diode mixer and a double-tuned circuit; a UHF tuner of good tuning characteristics comprising the fact that a $\pi$-type impedance converter portion consisting of capacitors is disposed in a coupling part between the diode mixer and the double-tuned circuit.

4 Claims, 3 Drawing Figures

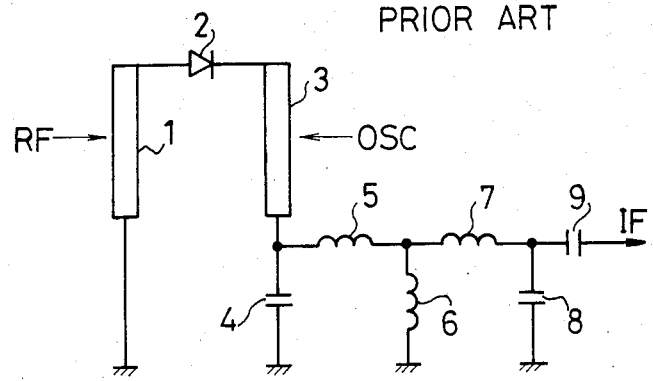
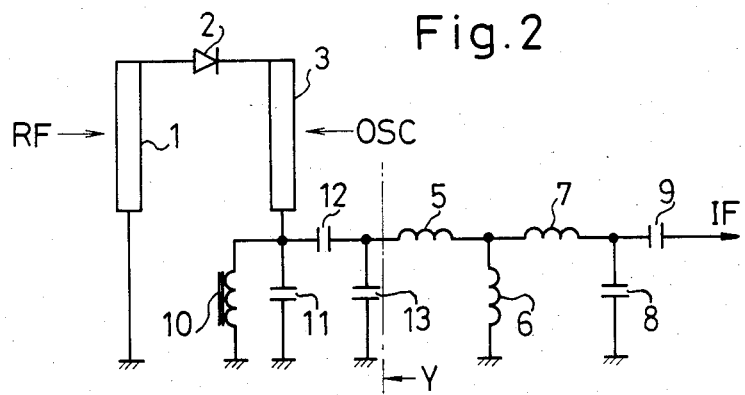
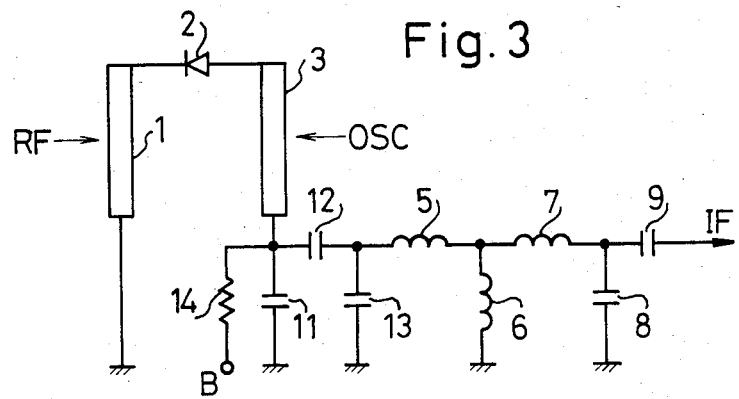

UHF MIXING CIRCUIT HAVING π CONFIGURED IMPEDANCE CONVERTER

BACKGROUND OF THE INVENTION

The present invention relates to a UHF mixing circuit, and more particularly to improvements in a UHF mixing circuit which has a diode mixer for mixing an input RF signal with an Oscillator signal and a double-tuned filter circuit for extracting either the sum or difference frequency resulting from mixing in the diode mixer.

The conventional UHF mixing circuit as shown in FIG. 1, comprises a diode mixer section and a double-tuned filter circuit connected thereto; the former being constructed of a coupling line 1 for electromagnetically coupling an RF signal into the mixer section, a mixer diode 2, a coupling line 3 for electromagnetically coupling an OSC signal into the mixer section, a capacitor 4, the capacitor being constructed of coils 5 through 7, and capacitors 8 and 9 capacitor. The RF and OSC signals flow into the mutually inductive coupling lines 1 and 3 of the loop circuit, and mixer diode 2 has the feature that it outputs non-linearly in response to its input. Because of this feature, the loop circuit generates an IF signal with a frequency that is the difference of the RF and OSC signal frequencies. This difference frequency signal is applied to the double-tuned filter circuit of coils 5–7 and capacitors 8–9. The IF signal which is the output of the double-tuned filter circuit is supplied to a VHF tuner, not shown. Since, in the prior-art example shown in FIG. 1, the double-tuned filter circuit is directly connected to the diode mixer, the impedance of the mixer diode 2 changes when subjected to input signals of different magnitudes, frequencies, etc. This has led to the disadvantage that an unfavorable state occurs in which the output waveform of the double-tuned filter circuit is non-linear to variations in the impedance of the mixer diode.

SUMMARY OF THE INVENTION

An object of the present invention is to eliminate the disadvantage of the prior art as mentioned above, and to provide a UHF mixing circuit having linear tuning characteristics.

In order to accomplish the object, according to the present invention, a UHF mixing circuit having a diode mixer and a double-tuned circuit is characterized in that a π-type impedance converter portion consisting of capacitors is disposed in a coupling part between the diode mixer and the double-tuned circuit.

BRIEF DESCRIPTION OF THE DRAWINGS

FIG. 1 is a circuit diagram showing the fundamental arrangement of a prior-art UHF mixing circuit;

FIG. 2 is a circuit diagram showing the arrangement of an embodiment of the present invention; and FIG. 3 is a circuit diagram showing the arrangement of another embodiment of the present invention.

PREFERRED EMBODIMENTS OF THE INVENTION

FIG. 2 is a circuit diagram showing the arrangement of an embodiment of the present invention, while FIG. 3 is a circuit diagram showing the arrangement of another embodiment of the present invention. In these figures, numerals 1 to 3 and 5 to 9 correspond to those in FIG. 1. Numeral 10 designates a choke coil, numerals 11 to 13 designate capacitors which constitute an impedance converter portion in the present invention, and numeral 14 (FIG. 3) designates a resistor.

Regarding the embodiment illustrated in FIG. 2, if $Z_M$ denotes the level-dependent impedance of the diode mixer, the admittance Y from the double-tuned circuit side (in the direction of arrow Y indicated in the figure) is expressed by the following equation (1):

$$Y = \frac{\omega^2 Z_M C_{12}^2 + j\omega\{(C_{12} + C_{13}) + \omega^2 Z_M^2(C_{11} + C_{12}) \times (C_{11}C_{12} + C_{12}C_{13} + C_{13}C_{11})\}}{1 + \omega^2 Z_M^2(C_{11} + C_{12})^2} \quad (1)$$

In Equation (1), $C_{11}$, $C_{12}$ and $C_{13}$ denote the capacitances of the capacitors, 11, 12 and 13, respectively. Assuming that the following inequalities (1') and (1'') hold true in Equation (1), equation (1) then reduces Equation (2):

$$\omega^2 Z_M^2(C_{11} + C_{12})^2 < < 1 \quad (1')$$

$$\omega^2 Z_M^2(C_{11} + C_{12})(C_{11}C_{12} + C_{12}C_{13} + C_{13}C_{11}) < < C_{12} + C_{13} \quad (1'')$$

$$Y = \omega^2 Z_M C_{12}^2 + j\omega(C_{12} + C_{13}) \quad (2)$$

In a practical example of the UHF mixing circuit, it is known that the impedance $|Z_M|$ of the diode mixer falls within a range of 200 to 500Ω and that the capacitances of the capacitors 11 to 13 are of the order of $10^{-11}$ to $10^{-12}$ F in the IF frequency band. Accordingly, the left-hand side of Inequality (1') is of the order of $10^{-2}$ or less, while the left-hand side of Inequality (1'') is of the order of $10^{-13}$ or less and the right-hand side thereof is of the order of $10^{-11}$. Thus, Inequalities (1') and (1'') may be considered to hold true. In addition, the reactance component of the impedance $Z_M$ of the diode mixer is neglected. This is based on the assumption that the reactance component does not change greatly due to variations in the drive level of the OSC signal (actually, the reactance component is substantially determined by an input circuit (on the RF side) added in a stage preceding the diode mixer).

The real part or $\omega^2 Z_M C_{12}^2$ of the admittance Y expressed by Equation (2) is of the order of $10^{-6}$, and is sufficiently small in comparison with the conductance component $j\omega(C_{12}+C_{13})$ (of the order of $10^{-4}$ or greater) of the double-tuned circuit. Therefore, the variation of the component of the admittance of the diode mixer becomes less than 1% of the total admittance, and its influence on the double-tuned circuit can be reduced. As a result, the waveform variation in the double-tuned circuit can be suppressed.

The embodiment illustrated in FIG. 3 is such that, in order to improve the operating characteristics of the mixer diode 2, this mixer diode 2 is biased through the resistor 14. In the foregoing embodiment shown in FIG. 2, the rectified current of the OSC signal is caused to flow through the choke coil 10. On the other hand, the embodiment shown in FIG. 3 is so constructed that the mixer diode 2 is forward-biased by a voltage B and that radio frequency current is caused to flow through the capacitor 11. This embodiment has an effect similar to that of the embodiment of FIG. 2.

As set forth above, according to the present invention, a π-type impedance converter portion consisting of capacitors is disposed between a diode mixer and a double-tuned circuit, whereby the double-tuned circuit is prevented from being affected by the impedance variation of the diode mixer, and a UHF mixing circuit of good tuning characteristics can be provided.

What is claimed is:

1. In a UHF mixing circuit having a diode mixer providing an output to the input of a double-tuned filter circuit, the improvement comprising a $\pi$-type impedance converter consisting of capacitors connected in $\pi$-shaped configuration coupled between the output of said diode mixer and the input to said double-tuned filter circuit.

2. A UHF mixing circuit according to claim 1, wherein a first electrode of said diode mixer is grounded through a first input signal coupling line, while a second electrode thereof is connected to said $\pi$-type impedance converter portion through a second input signal coupling line.

3. A UHF mixing circuit according to claim 2, wherein a cathode of said diode mixer is said first electrode, and a positive voltage is applied to a node between said second input signal coupling line and said $\pi$-type impedance converter portion through a resistor.

4. A UHF mixing circuit according to claim 2, wherein an anode of said diode mixer is said first electrode, and a node between said second input signal coupling line and said $\pi$-type impedance converter portion is grounded D.C.-wise.

* * * * *